Figure 1:
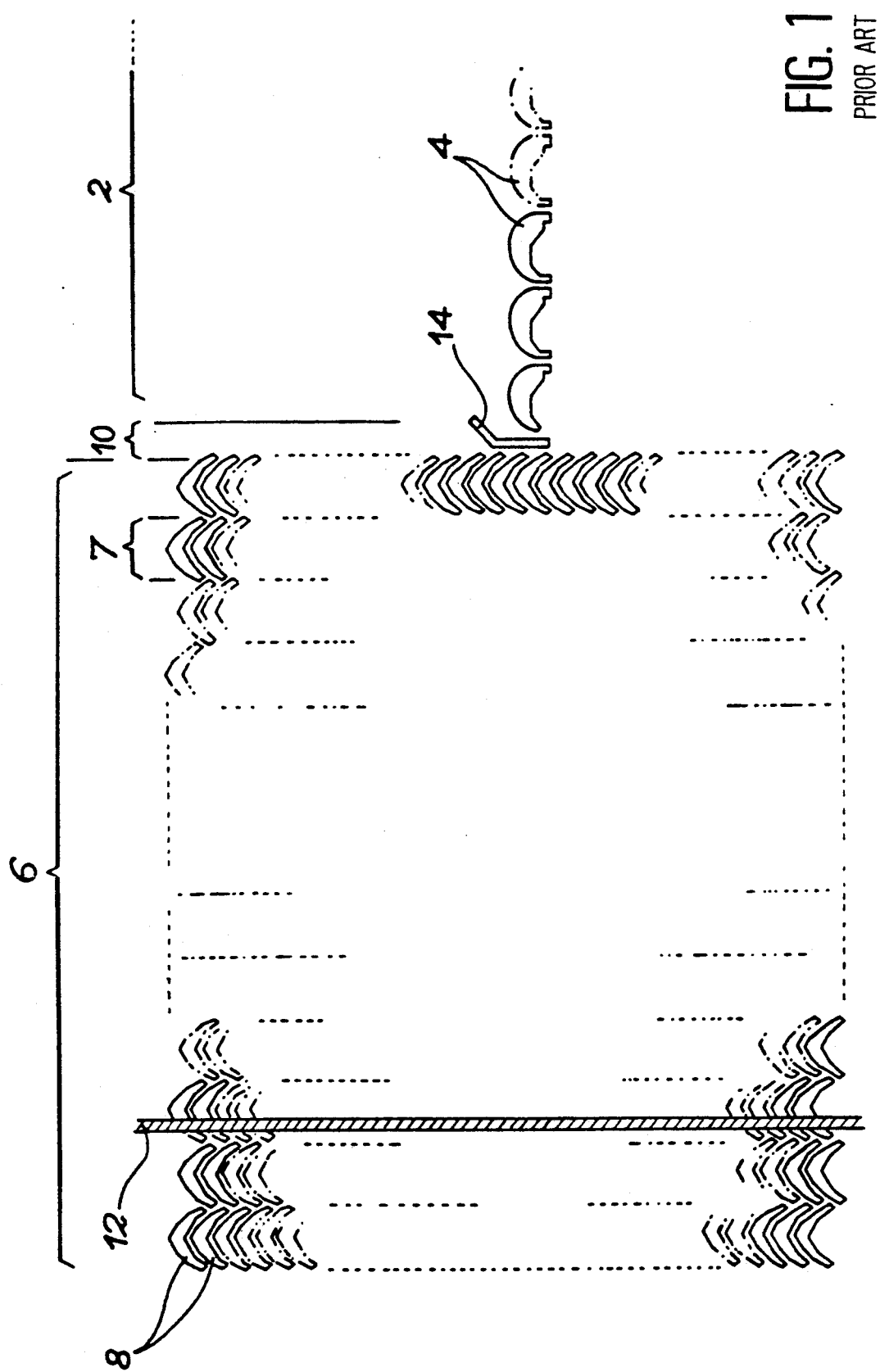

United States Patent [19]
Fedeli et al.

[11] Patent Number: 5,088,059
[45] Date of Patent: Feb. 11, 1992

[54] DETECTION DEVICE FOR MAGNETIC BUBBLE MEMORY

[75] Inventors: Jean-Marc Fedeli, Beaucroissant; Joël Magnin, Saint Martin d'Heres, both of France

[73] Assignee: Commissariat a l'Energie Atomique, Paris, France

[21] Appl. No.: 496,941

[22] Filed: Mar. 21, 1990

[30] Foreign Application Priority Data

Mar. 31, 1989 [FR] France ................. 89 04275

[51] Int. Cl.⁵ .................................. G11C 19/08
[52] U.S. Cl. ............................ 365/8; 365/43
[58] Field of Search ..................... 365/8, 43, 36

[56] References Cited

U.S. PATENT DOCUMENTS

| 4,460,976 | 7/1984 | Bobeck | 365/8 |
| 4,502,129 | 2/1985 | Suzuki et al. | 365/8 |

FOREIGN PATENT DOCUMENTS

| 73305 | 3/1983 | European Pat. Off. |
| 56-025282 | 3/1981 | Japan . |
| 58-83378 | 5/1983 | Japan . |
| 58-215782 | 12/1983 | Japan . |
| 8103237 | 11/1981 | PCT Int'l Appl. |

Primary Examiner—Joseph A. Popek
Attorney, Agent, or Firm—Oblon, Spivak, McClelland, Maier & Neustadt

[57] ABSTRACT

Detection device for a magnetic bubble memory having a detection zone (6) constituted by rows (7) of patterns (8) suitable for the propagation of bubbles in strip form, as well as a transition zone (10) making it possible to draw out the bubbles in strip form. The transition zone 10 has at least one row (18) of soft magnetic material patterns, (18) which has at least one central pattern (22) and a second pattern (24) adjacent to the central pattern (22). The central pattern (22) has a first part (22a) able to guide a magnetic bubble and a second part (22b) able to aid the propagation of a bubble in strip form. The second pattern (24) is able to aid the propagation of a bubble in strip form, while not disturbing the propagation of a bubble along the first part (22a) of the central pattern (22).

7 Claims, 5 Drawing Sheets

DETECTION DEVICE FOR MAGNETIC BUBBLE MEMORY

DESCRIPTION

The present invention relates, in the field of magnetic bubble memories, to the detection of magnetic bubbles and particularly the drawing out of the bubbles in strip form at the exit of a propagation path and at the entrance of the detection device.

In a magnetic bubble memory, the magnetic bubbles are contained in a monocrystalline magnetic layer or film, such as a magnetic garnet film, supported by an amagnetic monocrystalline garnet. These bubbles are in the form of generally cylindrical, isolated magnetic domains having a reverse magnetization to that of the remainder of the monocrystalline magnetic layer. These magnetic bubbles are stable through the application of a continuous magnetic field $H_{pol}$ perpendicular to the magnetic layer plane. In practice, said magnetic field is produced by a permanent magnet thus ensuring the non-volatility of the information contained in the bubble memory.

The bubbles are moved by applying a rotary continuous field $H_T$ in a direction parallel to the surface of the magnetic layer. The displacement of the bubbles takes place around so-called propagation patterns. The latter are in the form of disks, lozenges, triangles, T's, chevrons, etc. and can be made from a soft magnetic material, e.g. based on iron and nickel and known as PERMALLOY, deposited on an isolating layer covering the magnetic layer, or are obtained by implanting ions in the upper part of the magnetic layer through a mask making it possible to define the shape of these patterns.

The displacement of the bubbles along the propagation patterns takes place for approximately a half-rotation period of the rotary magnetic field $H_T$. During the other half-period, the bubbles pass from one pattern to the adjacent pattern. Thus, shift registers are obtained in which the binary information 1 is represented by the presence of a bubble and the binary information 0 by the absence of a bubble. The outlet of a bubble memory is constituted by a propagation path leading to a detection array, which forms a memory reading means.

FIG. 1 diagrammatically shows part of a known detection array. The propagation path 2, constituted by a succession of propagation patterns 4, which can be likened to asymmetrical half-moons, passes the bubbles representing the information to be read to the detection zone 6. The latter is constituted by rows 7 of patterns 8 with a similar configuration to chevrons and which may optionally successively contain an increasing number of patterns 8.

Before reaching the detection zone 6, each magnetic bubble passes through a transition zone 10, which aids the drawing out of the bubble in strip form. Thus, it is in the form of a strip that the bubbles propagate between individual rows 7 in the detection zone 6. Their passage beneath a magnetoresistive element 12 makes it possible to detect them and the bubbles are then discharged.

In FIG. 1, the transition zone 10 is constituted by a pattern 14 shaped like a jointed bar and substantially parallel to the rows 7 of the detection zone 6.

Figure 2:
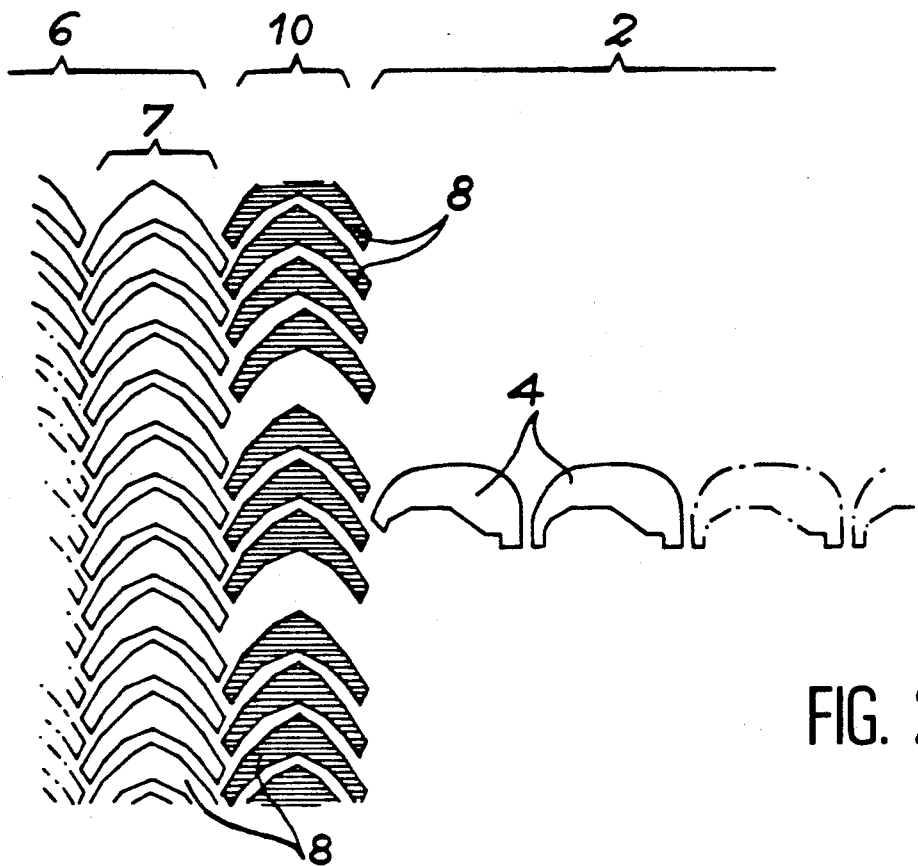

FIG. 2 diagrammatically shows a partial view of a known detection array. It is possible to see the transition zone 10 aiding the drawing out of the bubbles from the propagation path 2 and propagating towards the detection zone 6.

The transition zone 10 is constituted by a row of patterns 8 identical to the rows 7 of the detection zone 6. However, two patterns are missing in this supplementary row, so as to isolate or separate a group of three patterns 8. These three patterns are in the extension of the propagation path 2 and are appropriate for the propagation of bubbles in strip form.

Figure 3:
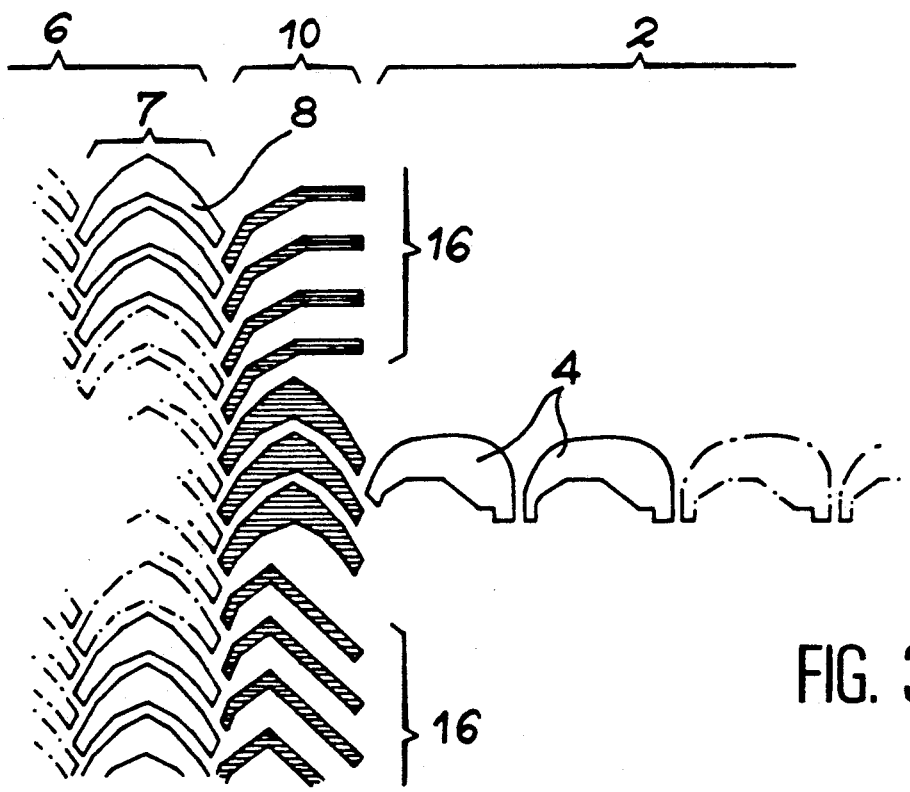

FIG. 3 diagrammatically shows a partial enlargement of another known detection array. The transition zone 10 in this case is constituted by a row of patterns. Three of these patterns located in the extension of the propagation path 2 are identical to the patterns 8 of the rows 7 of the detection zone 6. The other patterns 16 of the row forming the transition zone 10 have a first part such that it does not influence the propagation of the bubbles and a second part favouring the propagation in strip form. Here again, the group of three patterns permits a propagation of the bubbles in strip form.

Such magnetic bubble memories function correctly for a value of the magnetic polarization field $H_{pol}$ in an interval commonly called a margin. The latter has a lower value normally called the margin bottom or field bottom and an upper value normally called the margin top or field top. The larger the margin, the more the bubble memory accepts variations compared with nominal operating values. For example, by increasing the margin, the tolerances on the accuracy of the geometry of the patterns or the operating temperature conditions are improved. Normally for a magnetic bubble with a diameter of 1 micron, a margin bottom of 400 $\alpha$ and a margin top of 430 $\alpha$ are obtained (1 $\alpha$ being equal to $\frac{1}{4}\pi 10^{-3}$ A/m).

The transition zone of the known detection arrays constitutes an important limitation to the margin. Thus, when the magnetic bubble memory functions at the margin top, the passage of a bubble from the final propagation pattern to the transition zone does not take place in an adequate manner, the bubble tending to disappear instead of being drawn out in strip-like form.

The object of the present invention is to increase the margin so as to obtain a wider operating range for magnetic bubble memories. For this purpose the invention recommends raising the margin top value by modifying the transition zone, in such a way that the drawing out does not take place in a sudden manner during the passage from a pattern guiding a bubble to a pattern aiding propagation in strip form. According to the invention, drawing out takes place progressively during the propagation within the transition zone, as a result of a particular geometry of the patterns of said zone.

More specifically, the invention relates to a detection device for magnetic bubble memories comprising a detection zone constituted by rows of patterns made from a soft magnetic material, the bubbles from a propagation path formed from propagation patterns of soft magnetic material propagating in strip form in said detection zone and a transition zone between the detection zone and the propagation path making it possible to draw out the bubbles from the propagation path in strip-like form.

The transition zone has at least one row of patterns made from soft magnetic material, said row having at least one central pattern in the extension of the propagation path and a second pattern adjacent to the central pattern. Said central pattern has a first part able to guide a magnetic bubble and a second part able to aid the propagation of a bubble in strip form. The second pattern aids the propagation of a bubble in strip form, whilst not disturbing the propagation of said bubble along the first part of the central pattern.

Thus, the drawing out of the bubble takes place during the propagation of the central pattern and not during a jump between two types of different patterns.

During their propagation in strip form, the bubbles are elongated perpendicular to the propagation direction of the bubbles along the propagation path.

According to a variant of the device, said row of the transition zone has a third pattern adjacent to the central pattern and which is able to aid the propagation of a bubble in strip form, but which does not disturb the propagation of a bubble along the first part of the central pattern.

According to another variant, said row of the transition zone has supplementary patterns on either side of the group formed by the central pattern and the second and possible third patterns. These supplementary patterns aid the propagation of a bubble in strip form, whilst not disturbing the propagation of a bubble along the first part of the central pattern. Thus, on passing out of the transition zone, a bubble is drawn out in strip form without any sudden passage between the patterns guiding the bubbles and the patterns propagating same in strip form.

According to another embodiment, the supplementary patterns are separated from said group by a space corresponding to an absence of at least one of the supplementary patterns on either side of said group. In this case, the supplementary patterns make it possible to reduce the size of the poles of the patterns of the following row for a field bottom.

The invention is described in greater detail hereinafter relative to non-limitative embodiments and the attached drawings, wherein show:

FIG. 1 Already described, diagrammatically part of a prior art magnetic bubble memory detection array.

FIG. 2 Already described, diagrammatically a partial view of another prior art detection array.

FIG. 3 Already described, diagrammatically a partial view of another prior art detection array.

Figure 4:
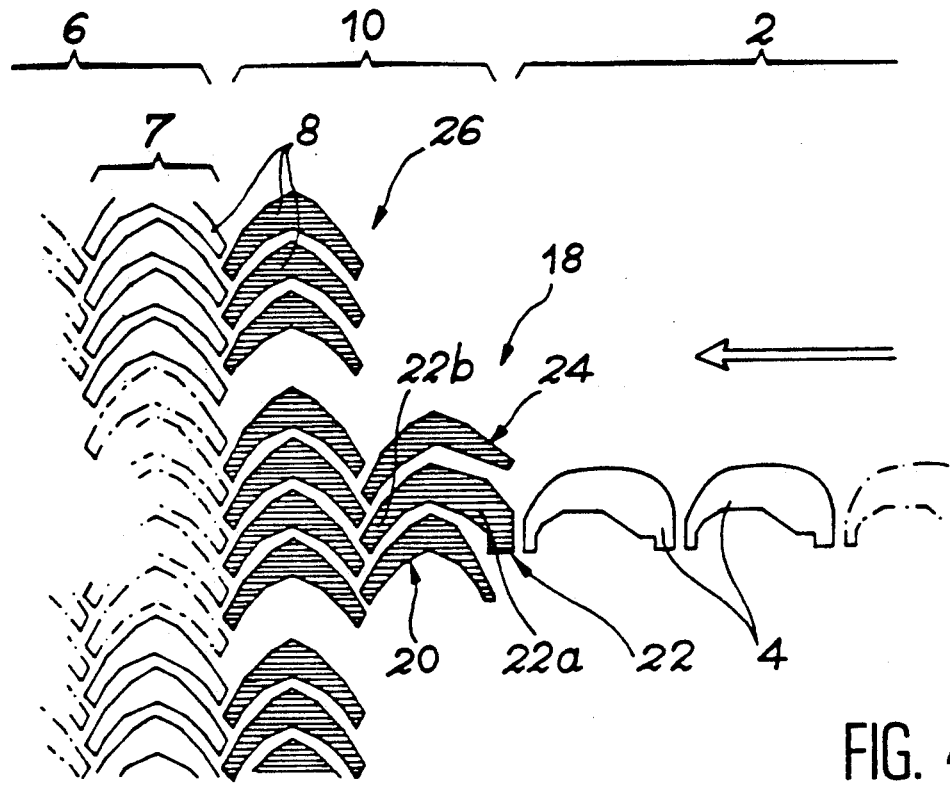

FIG. 4 Diagrammatically a partial view of a detection device according to the invention.

Figure 5:
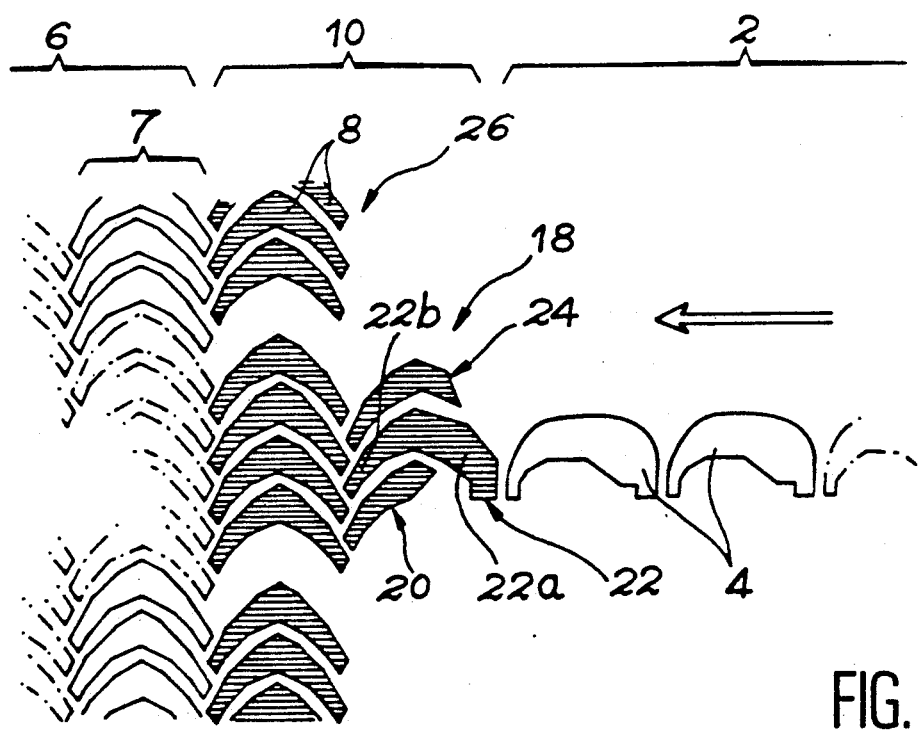

FIG. 5 Diagrammatically an enlargement of a transition zone of a detection device according to the invention.

Figure 6:
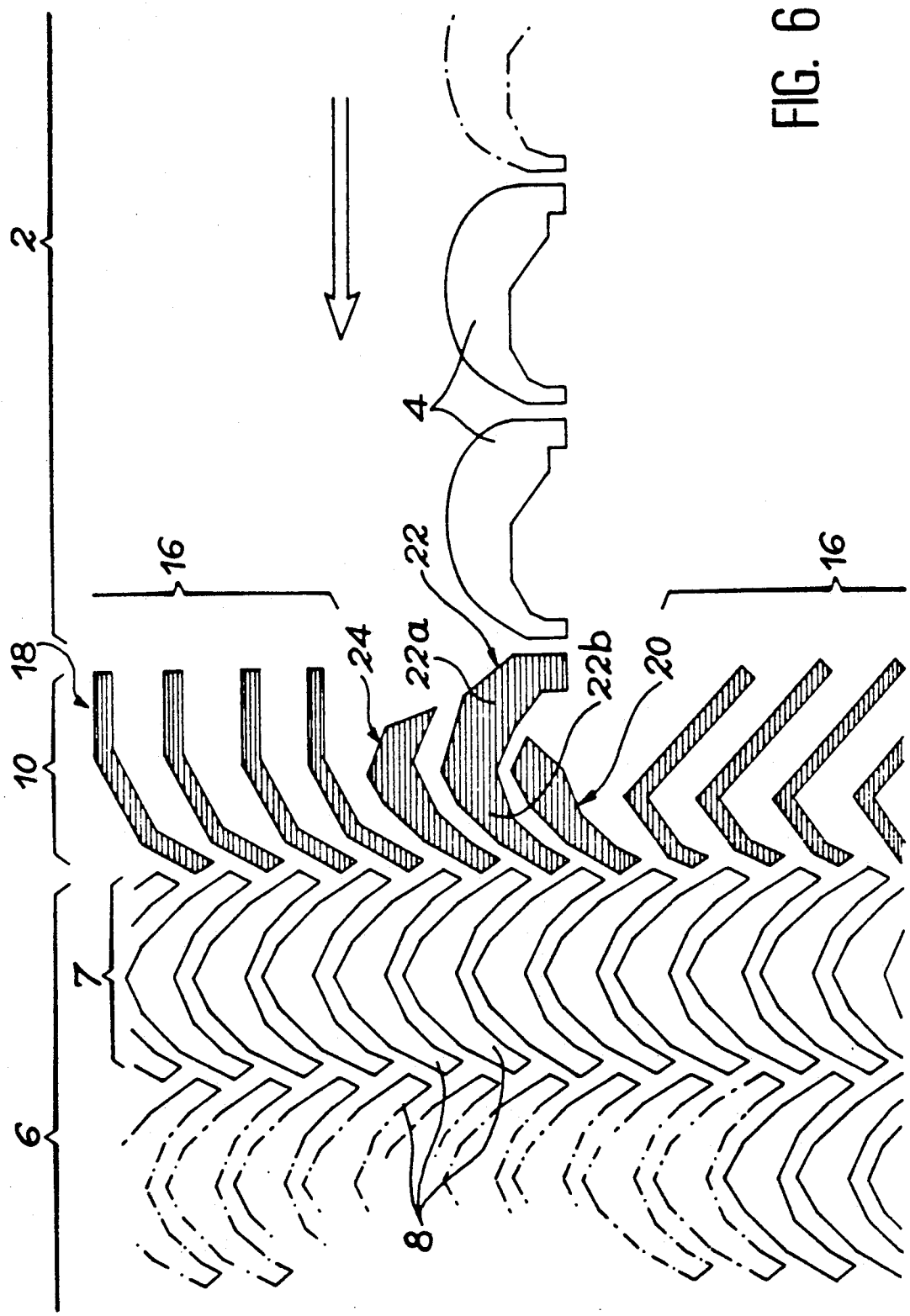

FIG. 6 Diagrammatically a partial view of a variant of the detection device according to the invention.

Figure 7:
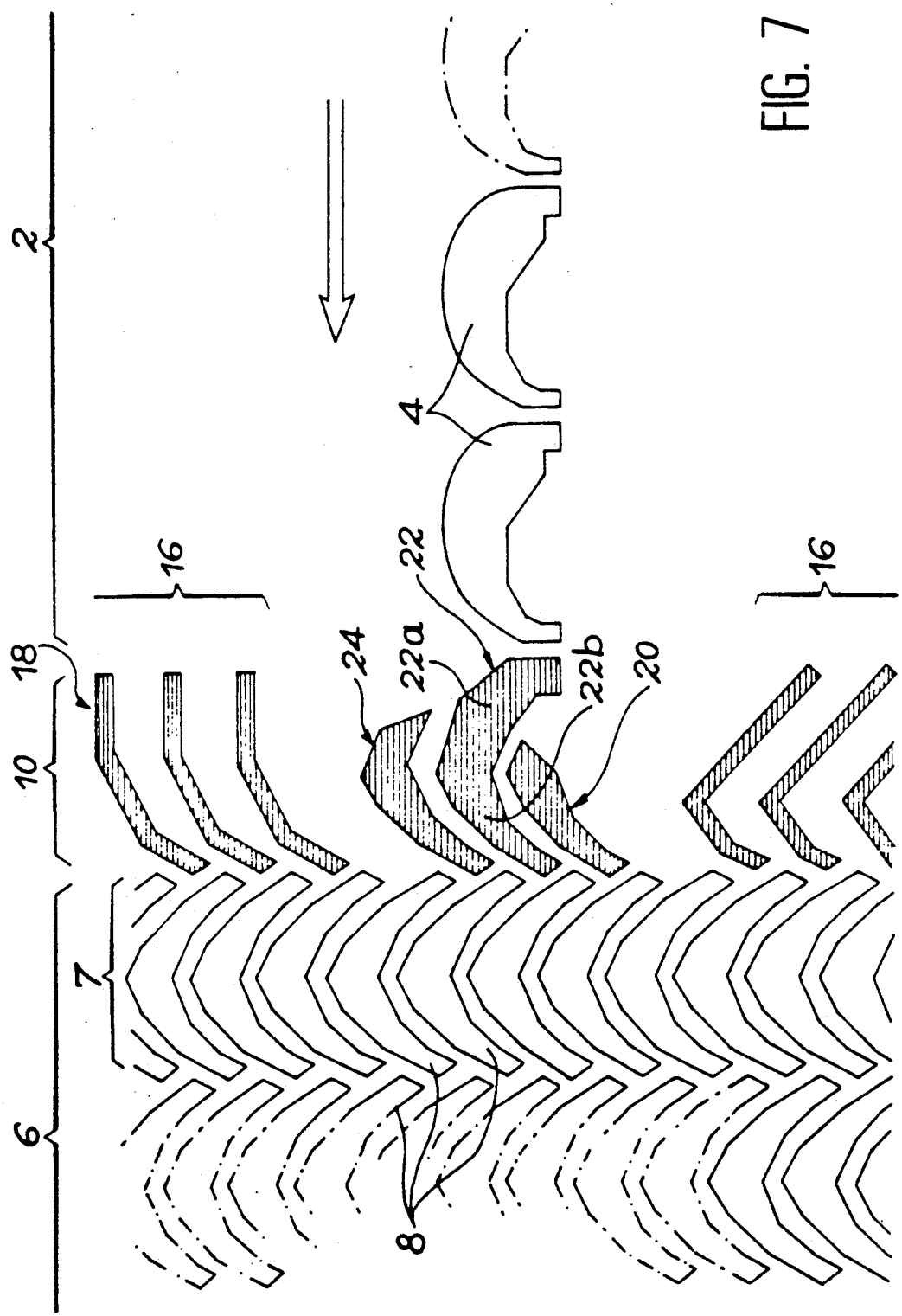

FIG. 7 Diagrammatically a partial view of another embodiment of a detection device according to the invention.

FIG. 4 is a diagrammatic partial view of a detection device according to the invention. It is possible to see that the transition zone 10 is constituted by two rows of patterns made from a soft magnetic material, e.g. PERMALLOY.

A first row 18 contiguous to the propagation path 2 only contains three patterns 20, 22, 24. The central pattern 22 located in the extension of the propagation path 2 has a first part 22a able to guide a magnetic bubble and a second part 22b able to favour the propagation of a bubble in strip form.

In the embodiment shown, the geometry of the first part 22a of the central pattern 22 is similar to the geometry of the first part of a propagation pattern 4. However, the second part 22b has a geometry similar to that of the second part of a pattern 8 belonging to a row 7 of the detection zone 6. Therefore the section of the first part of the central pattern is larger than the section of the second part.

For example, for the propagation and drawing out of a bubble with a diameter of 1 micron, the first part 22a of the central pattern can have a section of approximately 5 microns and the second part a section of approximately 1.5 micron.

As a result of pattern 22, the bubble is progressively drawn out in strip form and is not drawn out suddenly during a jump between two patterns.

At least one second pattern able to assist the propagation of a bubble in strip form and adjacent to the central pattern 22 makes it possible for the bubble to be drawn out.

In the case where only one second pattern is present, the latter is positioned above the main pattern 22, i.e. if, as shown in FIG. 4, the central pattern 22 has a shape similar to a crescent, the second pattern is positioned above the convexity of the central pattern 22.

In the embodiment shown in FIG. 4, row 18 has two patterns 20, 24 on either side of the central pattern 22. These two patterns 20, 24 are such that they favour the propagation of a bubble in strip form, whilst not disturbing the propagation of the bubble on the first part 22a of the central pattern 22. It can be seen that the ends of the patterns 20, 24 adjacent to the central pattern 22 are spaced from the part 22a and then progressively approach one another. In order not to disturb the propagation of the bubbles on the propagation patterns 4 and their jump on the central pattern 22, the ends of the patterns 20, 24 are moved away from the final propagation pattern 4 by a distance equal to at least three times the diameter of a bubble.

This first row 18 can be followed (in the propagation direction symbolized by an arrow in FIG. 4) by a second row 26. The patterns 8 of the latter are identical to those of a row 7 of the detection zone 6. Two patterns are missing, thus isolating a group of four patterns located in the extension of the patterns 20, 22, 24 of the first row 18.

A bubble is drawn out in strip form on passing through the first row 18 and is further elongated passing through the second row 26 on its four patterns. A bubble in strip form is elongated perpendicular to the propagation direction of the bubbles along the propagation path. In other words, the orientation of the patterns 4 of the propagation path is identical to that of the chevrons of the transition and detection zones 10, 6. The bubble in strip form then propagates in the detection zone 6 for reading purposes.

FIG. 5 diagrammatically shows an enlargement of a transition zone 10 of a detection device according to the invention. In this embodiment, the transition zone 10 has two rows 18, 26 of patterns. The first row 18 is constituted by three patterns 20, 22, 24. The patterns 20, 24 adjacent to the central pattern 22 do not occupy the entire width of the row 18. Only those parts of said patterns 20, 24 adjacent to the second part 22b of the central pattern 22 are present. Therefore the propagation of a bubble is not disturbed during the passage along the first part 22a of the central pattern 22. However, during the passage along the second part 22b, the bubble undergoes the influence of magnetic poles, constituted by patterns 20, 24, which aids its progressive drawing out. The second row 26 is identical to that shown in FIG. 4.

FIG. 6 diagrammatically shows a partial view of a variant of a detection device according to the invention. The transition zone 10 is only constituted by one row 18. The central pattern 22 and the adjacent patterns 20, 24 are identical to those shown in FIG. 5.

Row 18 has supplementary patterns 16 on either side of the group constituted by the central pattern 22 and the adjacent patterns 20, 24. These supplementary patterns 16 are able to favour the propagation of a bubble in strip form, whilst not disturbing the propagation of a bubble along the first part 22a of the central pattern 22.

FIG. 7 shows another variant of that shown in FIG. 6. It is possible to see that the supplementary patterns 16 are separated from the group constituted by the central pattern 22 and the adjacent patterns 20, 24 by a space, which corresponds to the absence of a supplementary pattern on either side of the central group. At the field bottom, these supplementary patterns make it possible to reduce the size of the poles of the patterns of the following row.

Thus, the transition zone of a detection device according to the invention permits a progressive drawing out of a bubble in strip form. The performance characteristics of a magnetic bubble memory using such a device are improved, the margin being increased. For example, a margin of 40 $\alpha$ is obtained for a field bottom of 400 $\alpha$ (for a bubble diameter of 1 micron), which represents an improvement of approximately 10 $\alpha$ compared with the performance characteristics of known devices.

We claim:

1. Detection device of magnetic bubbles, in a magnetic bubble memory having a propagation path for magnetic bubbles formed by propagation patterns of soft magnetic material said propagation path having an end with a final propagation pattern, said device comprising:
   a detection zone, suitable for magnetic bubble propagation in strip form, constituted by rows of patterns of soft magnetic material;
   a transition zone for stretching magnetic bubbles from said final propagation pattern into the form of a strip,
   wherein the transition zone has at least one row of patterns of soft magnetic material, said row having at least one asymmetrical central pattern adjacent to said end of the propagation path and a second asymmetrical pattern adjacent to the central pattern, said central pattern having a first part able to guide a magnetic bubble and a second part favoring the propagation of a bubble in strip form, said second pattern favoring propagation of bubbles in strip form without disturbing the propagation of a bubble along the first part of the central pattern, propagation patterns in said transition zone being suitable for stretching bubbles into said form of a strip, said form of a strip being perpendicular to a propagation direction of bubbles along the propagation path.

2. Device according to claim 1, wherein said row of the transition zone has a third asymmetrical pattern adjacent to the central pattern and favoring the propagation of a bubble in strip form, whilst not disturbing the propagation of a bubble along the first part of the central pattern.

3. Device according to claim 2, wherein said row of the transition zone has supplementary patterns on either side of the group constituted by the central pattern and the second and third patterns, said supplementary patterns favoring the propagation of a bubble in strip form, whilst not disturbing the propagation of a bubble along the first part of the central pattern.

4. Device according to claim 2, wherein said row of the transition zone has supplementary patterns on either side of the group constituted by the central pattern and the second and third patterns, said supplementary patterns being separated from said group by a space corresponding to an absence of at least one of said patterns on either side of said group.

5. Device according to claim 2, wherein the third pattern has an end spaced from said final propagation pattern by a distance equal to at least three times the diameter of a bubble.

6. Device according to claim 1, wherein the first part of the central pattern has a section larger than that of the second part of the central pattern.

7. Device according to claim 1, wherein the second pattern has an end spaced from said final propagation pattern by a distance equal to at least three times the diameter of a bubble.

* * * * *